United States Patent [19]

Burns et al.

[11] Patent Number: 5,369,056

[45] Date of Patent: Nov. 29, 1994

[54] WARP-RESISTENT ULTRA-THIN INTEGRATED CIRCUIT PACKAGE FABRICATION METHOD

[75] Inventors: Carmen D. Burns; James W. Cady; Jerry M. Roane, all of Austin; Phillip R. Troetschel, Buda, all of Tex.

[73] Assignee: Staktek Corporation, Austin, Tex.

[21] Appl. No.: 37,830

[22] Filed: Mar. 29, 1993

[51] Int. Cl.$^5$ .................................. H01L 21/60
[52] U.S. Cl. ........................ 437/209; 437/211; 437/214; 437/215; 437/217; 437/219
[58] Field of Search ............... 437/209, 211, 212, 213, 437/214, 215, 217, 220, 219; 257/730, 683, 684, 787, 788

[56] References Cited

U.S. PATENT DOCUMENTS

| | | | |
|---|---|---|---|
| 2,241,493 | 12/1960 | Andrulits et al. | 437/209 X |
| 3,436,604 | 4/1966 | Hyltin et al. | |
| 3,614,546 | 10/1971 | Avins | 174/35 R |
| 3,713,893 | 1/1973 | Shirland | 437/205 X |
| 3,739,462 | 6/1973 | Hasty | 29/577 |
| 4,103,318 | 7/1978 | Schwede | 361/388 |
| 4,158,745 | 6/1979 | Keller | 174/52 FP |
| 4,288,841 | 9/1981 | Gogal | 361/414 |
| 4,321,418 | 3/1982 | Dran et al. | 264/102 X |
| 4,437,235 | 3/1984 | McIver | 29/840 |
| 4,451,973 | 6/1984 | Tateno et al. | 29/588 |
| 4,521,828 | 6/1985 | Fanning | 174/52.4 |
| 4,525,921 | 7/1985 | Carson et al. | 29/577 |
| 4,530,152 | 7/1985 | Roche et al. | 437/211 |
| 4,630,172 | 12/1986 | Stenerson et al. | 361/386 |
| 4,680,617 | 7/1987 | Ross | 357/72 |
| 4,684,975 | 8/1987 | Takiar et al. | 357/70 |
| 4,722,060 | 1/1988 | Quinn et al. | 364/490 |
| 4,733,461 | 3/1988 | Nakano | 29/830 |
| 4,763,188 | 8/1988 | Johnson | 357/74 |
| 4,796,078 | 1/1989 | Phelps, Jr. et al. | 357/68 |
| 4,821,148 | 4/1989 | Kobayashi et al. | 257/790 |
| 4,823,234 | 4/1989 | Konishi et al. | 174/52.2 |
| 4,829,403 | 5/1989 | Harding | 174/52.2 |
| 4,833,568 | 5/1989 | Berhold | 361/383 |
| 4,839,717 | 6/1989 | Phy et al. | 357/74 |
| 4,855,868 | 8/1989 | Harding | 174/52.2 |

(List continued on next page.)

FOREIGN PATENT DOCUMENTS

| | | |
|---|---|---|
| 57-31166 | 2/1982 | Japan. |
| 58-96756A | 6/1983 | Japan. |
| 58-112348 | 7/1983 | Japan. |
| 61-163652 | 1/1985 | Japan. |
| 60-180150A | 9/1985 | Japan. |
| 63-153849 | 6/1988 | Japan. |

OTHER PUBLICATIONS

Information allegedly written by Emory Garth regarding "Memory Stacks," Applicant received a facsimile from Emory Garth on Jan. 26, 1993, publication date unknown.

Catalog of Dense-Pac Microsystems, Inc. describing two products: DPS512X16A3 Ceramic 512K X 16 CMOS SRAM Module and DPS512X16AA3 High Speed Ceramic 512K X 16 CMOS SRAM Module, pp. 865–870. Publication date unknown.

*Primary Examiner*—Brian Hearn
*Assistant Examiner*—Kevin M. Picardat
*Attorney, Agent, or Firm*—Fulbright & Jaworski

[57] ABSTRACT

The present invention provides a method for fabricating modified integrated circuit packages that are ultra-thin and resist warping. The integrated circuit packages are made thinner by removing some of the casing material uniformly from the upper and lower major surfaces of the integrated circuit package. To prevent the resulting ultra-thin integrated circuit package from warping, a thin layer of material with a coefficient of thermal expansion less than that of silicon is mounted to the upper major surface of the package after some of the casing material has been removed uniformly from the upper major surface. Also, a thin layer of material with a coefficient of thermal expansion greater than that of silicon may be mounted to the lower major surface of the package after some of the casing material has been removed uniformly from the lower major surface. The result is an ultra-thin integrated circuit package that is thermally and mechanically balanced to prevent warping.

18 Claims, 4 Drawing Sheets

U.S. PATENT DOCUMENTS

| | | | |
|---|---|---|---|
| 4,862,245 | 8/1989 | Pashby et al. | 357/70 |
| 4,862,249 | 8/1989 | Carlson | 357/80 |
| 4,878,106 | 10/1989 | Suchs | 257/706 |
| 4,884,237 | 11/1989 | Mueller et al. | 365/63 |
| 4,891,789 | 1/1990 | Quattrini et al. | 365/63 |
| 4,948,645 | 8/1990 | Holzinger et al. | 156/252 |
| 4,953,005 | 8/1990 | Carlson et al. | 357/80 |
| 4,953,060 | 8/1990 | Lauffer et al. | 361/388 |
| 4,994,411 | 2/1991 | Naito et al. | 437/217 |
| 4,997,517 | 3/1991 | Parthasarathi | 156/630 |
| 5,014,113 | 5/1991 | Casto | 357/70 |
| 5,016,138 | 5/1991 | Woodman | 361/381 |
| 5,041,015 | 8/1991 | Travis | 439/492 |
| 5,049,527 | 9/1991 | Merrick et al. | 437/220 |
| 5,057,906 | 10/1991 | Ishigami | 257/706 |
| 5,065,277 | 11/1991 | Davidson | 361/383 |
| 5,086,018 | 2/1992 | Conru et al. | 437/237 |
| 5,099,393 | 3/1992 | Bentlage et al. | 361/413 |
| 5,108,553 | 4/1992 | Foster et al. | 29/852 |
| 5,138,430 | 8/1992 | Gow, 3rd et al. | 437/209 |
| 5,138,434 | 8/1992 | Wood et al. | 357/74 |
| 5,139,969 | 8/1992 | Mori | 437/217 |
| 5,147,822 | 9/1992 | Yamazaki et al. | 437/215 |
| 5,151,559 | 9/1992 | Conru et al. | 174/52.4 |
| 5,155,068 | 10/1992 | Tada | 437/211 |
| 5,214,845 | 6/1993 | King et al. | 29/841 |
| 5,223,739 | 6/1993 | Katsumata et al. | 257/787 |

WARP-RESISTENT ULTRA-THIN INTEGRATED CIRCUIT PACKAGE FABRICATION METHOD

SPECIFICATION

BACKGROUND OF THE INVENTION

A. Field of the Invention

This invention relates to a method for fabricating warp-resistant ultra-thin integrated circuit packages. In particular, the invention relates to reducing the thickness of the layers of the integrated circuit package and mounting thin layers of material to the upper and lower major surfaces of the integrated circuit package to prevent thermal and mechanical warping.

B. Discussion of the Related Technology

Packaging techniques for integrated circuits have been developed in the past in an attempt to satisfy demands for miniaturization in the semiconductor industry. Improved methods for miniaturization of integrated circuits enabling the integration of millions of transistor circuit elements into single integrated silicon embodied circuits, or chips, have resulted in increased emphasis on methods to package these circuits in space efficient, yet reliable and mass-producible packages.

The introduction of highly sophisticated integrated circuit computers and other common bus systems utilizing a variety of integrated circuit elements such as memory devices (DRAMs, VRAMs, FLASH ROMs, E-ROMs, and SRMs), programmable logic arrays (PLAs), microprocessors (CPUs), coprocessors, and other related integrated circuit elements which had to be assembled, mounted and interconnected into as compact, yet reliable packages as feasible to satisfy the industry demands for miniaturization.

Other key considerations in developing packaging for such circuits have been the cost of manufacture, the reliability of the packaged device, heat transfer, moisture penetration, standardization of mounting and interconnect methods and the ability to test and control the quality of the packaged devices.

In the past, one area of concentration for high density packaging has been memory devices such as SRAMs and DRAMs. Prior systems typically utilized a transfer molded plastic encasement surrounding the integrated circuit and having one of a variety of pin-out or mounting and interconnect schemes. The older M-DIPs (Dual-In-Line-Plastic) provides a relatively flat, molded package having dual parallel rows of leads extending from the bottom for through-hole connection and mounted to an underlying circuit board substrate. These packages provided 100 mil spacing between leads.

A more dense package was the 100 mil SIP (Single-In-Line-Plastic), which was assembled on edge with two rows of 100 mil staggered leads extending from the bottom edge for through-hole assembly. Another popular prior art package is the PLCC (Plastic Leaded Chip Carrier), SOJ (Small Outline J-leaded) molded package with twenty surface-mount designed J-leads (length 0.67", width 0.34", height 0.14").

Higher density versions of the SIMM (Single-In-Line Memory Module) design with even smaller versions of the DRAM plastic package have been developed. These thinner versions of SOJ DRAMs are one-half the thickness (having a plastic packaging thickness of about 70 mils) of standard SOJ designs, and have been mounted on both sides of circuit board substrates. Even smaller TSOP (Thin Small Outline Package) packages have been developed experimentally with a plastic thickness of 1 millimeter and lower profile gull-wing leads for surface mounting. Based on experience with these prior art designs, for reasons of reliability related to moisture penetration and mechanical integrity, the industry has adopted a standard thickness for plastic packaging of approximately 1 millimeter (40 mils), or approximately 10.5 mils on each side of an 11 mil thick integrated circuit element attached to a 6 mil thick lead frame.

In an attempt to configure electronic systems in ever smaller packages, new methods and apparatus comprising three-dimensional stacked integrated circuit packages have been developed as more fully described in U.S. patent application Ser. Nos. 07/561,417 and 07/884,066, filed Aug. 1, 1990 and May 15, 1992, respectively, both having the common assignee of the present invention and incorporated herein by reference for all purposes. Such multiple package modules pose an even greater need for heat dissipation.

An example of a fabrication method and apparatus for lead-on chip integrated circuits having improved thermal dissipation characteristics is more fully described in co-pending U.S. patent application Ser. No. 07/746,268, filed Aug. 15, 1991, Patent Cooperative Treaty International Application No. PCT/US92/06778, and U.S. patent application Ser. No. 07/783,737, filed on Oct. 28, 1991, each having the common assignee of the present invention and incorporated herein by reference for all purposes. There are integrated circuit packages in commercial production, such as, for example, the TSOP type whose thermal transfer characteristics could be improved upon after manufacture by modifying such packages in accordance with the present invention, thus allowing greater integrated circuit packaging densities and improved reliability.

An example of a fabrication method and apparatus for high density lead-on-packages achieved by laminating one or more lead frames to a standard integrated circuit package is more fully described in co-pending U.S. patent application Ser. No. 07/990,334, filed Dec. 11, 1992, having the common assignee of the present invention and incorporated herein by reference for all purposes. This co-pending U.S. patent application Ser. No. 07/990,334 discloses the use of a stiffener to prevent the warping of a thin integrated circuit package, but this stiffener provides resistance only to mechanical warpage.

In contrast to such prior art technology, the fabrication method of the present invention provides warp-resistant ultra-thin integrated circuit packages that are thermally and mechanically balanced to prevent the ultra-thin profile packages from warping.

SUMMARY OF THE INVENTION

The present invention provides a method for fabricating modified integrated circuit packages from standard integrated circuit packages to provide enhanced thermal conductivity. Achieving improved thermal transfer characteristics from an integrated circuit package results in better heat dissipation and more reliable operation. Using standard commercially-available integrated circuit packages, such as TSOP, allows economical and rapid fabrication of thermally and electrically superior electronic circuits for applications that demand high reliability and performance. Furthermore, the modification provided by the present invention greatly facilitates use of the modified package in a multi-unit, stacked three-dimensional module by providing warp-resistant ultra-thin integrated circuit chip packages so the module will take up less space.

In order to achieve the thinnest package possible, all fabrication layers needed to construct a useful integrated circuit package must be minimized in thickness and number. The present invention discloses an ultra-thin integrated circuit package, which results from reducing the number of layers and the thickness of each layer to a minimum during fabrication of the package elements.

An integrated circuit package contains an integrated circuit die attached to an internal lead frame, which are encapsulated with materials such as transfer-molded plastic. A feature of the present invention is to make the integrated circuit package thinner by lapping or grinding off some of the casing material. A thinner integrated circuit package, however, may warp during fabrication or use due to dissimilar coefficients of thermal expansion in the various layers or component parts which comprise the package. To prevent warping while still maintaining a thin profile, a thin layer of material with a coefficient of thermal expansion that is equal to or less than the coefficient of thermal expansion of silicon is mounted to the upper major surface of the integrated circuit package after the upper major surface has been made thinner by lapping or grinding off some of the casing material uniformly. A suitable material with a coefficient of thermal expansion less than that of silicon that is mounted to the upper major surface of the integrated circuit package may be, for example, Invar. This material can be mounted to the upper major surface of the integrated circuit package with a high temperature epoxy that has a plasticizer that permits expansion without cracking, such as Able Film ™. The selected epoxy should also have a good shear characteristic at high temperature, and good resistance to moisture penetration. Alternatively, a high temperature thermoplastic without plasticizer, such as AbleLog ™ T1-5501, may be used in less environmentally demanding applications.

The integrated circuit package is made thinner by removing a portion of the lower major surface of the integrated circuit package uniformly to the point where one has achieved the overall thickness desired. The removal of some of the lower major surface of the integrated circuit package will include the casing material and may include some of the integrated circuit die.

In an alternative embodiment, a thin layer of material with a coefficient of thermal expansion that is greater than the coefficient of thermal expansion of silicon and preferably approximately equal to that of the casing material is mounted to the lower major surface of the integrated circuit package to prevent warping. The material with a coefficient of thermal expansion that is greater than that of silicon may be, for example, aluminum or copper. This material can be mounted to the lower major surface of the integrated circuit package with a high temperature epoxy similar to that used on the upper surface.

The thickness of the layers of the materials mounted to the upper and lower major surfaces of the integrated circuit package depends on the resulting thermal balance throughout the package to avoid warping of the integrated circuit package. When the integrated circuit package is cooled after it is cured, it tends to warp due to thermal imbalances in the different materials that make up the layers of the integrated circuit package. This tendency to warp increases as the integrated circuit package is made thinner. Unless warpage is controlled, the molded package will bend unacceptably upon cooling from its bonding temperature to cooler storage and operational temperatures. An unacceptable level of warping may be as little as one mil but certainly includes three mils. This level of warping detracts from the integrity of the package and may induce cracking in the die. A potential for package bow results from the method of package construction which utilizes stacked layers of different materials, with each material exhibiting a different coefficient of thermal expansion (CTE). Each material layer, upon cooling, seeks its new dimensions according to its CTE, but is restrained by the presence of the other material layers which make up the assembly. The forces produced by these restraining layers, if not minimized and balanced by proper design, materials selection, and construction, can produce undesirable warpage.

The present invention provides a method of warpage control that minimizes the differential thermal expansion forces and moments between the material layers on either side of a neutral thermodynamic axis in the assembly. The neutral thermodynamic axis is chosen for convenience to be the plane through the center of the copper lead frame. The total warpage-causing moments on either side of the neutral thermodynamic axis are the sum of the moments associated with each layer, relative to the neutral thermodynamic axis. For a particular layer, the moment, m, is proportional to the following product:

$$m \cong (E)(h)(t)\Delta(a)\Delta(T)$$

where m is the moment of the layer; E is the Young's modulus of elasticity of the layer material; h is the moment-arm distance of the center of the layer from the neutral thermodynamic axis; t is the layer thickness; $\Delta(a)$ is the difference in CTE of the layer and that of the material containing the neutral thermodynamic axis; and $\Delta(T)$ is the temperature difference between assembly bonding temperature and operation, storage, or other temperatures of interest.

The product $\Delta(a)\Delta(T)$ is the source of forces and moments, the product $(E)(t)$ is the deflection compliance of the layer with the differential force, and h is the lever arm allowing the force to produce a moment with its resulting warpage.

The product in the above equation, for moment, m, is evaluated for each layer on one side of the neutral thermodynamic axis and these values summed. The process is repeated for the layers on the opposite side of the neutral thermodynamic axis and the two sums compared. The package materials and dimensions are then adjusted until the sums are either equal or acceptably close enough in value to assure acceptably low values of warpage. In other words, the vectorial summation of all of the moments of each layer is as close to zero as possible.

A key advantage of the present invention is that one can asymmetrically locate elements formed of different materials in the package and thermally balance them. Thus the integrated circuit die does not have to be symmetrically centered in the package in order to obtain thermal balance throughout the integrated circuit package. Application of the method of the present invention allows one to compensate for material and orientation asymmetries in the integrated circuit package to prevent warping.

An alternative, more refined embodiment confines the upper surface lamination to that area directly overlaying the die within the package. The integrated circuit package is first made thinner by lapping or grinding off some of the casing material uniformly on the upper major surface of the package. Then a material with a coefficient of thermal expansion less than that of silicon is mounted only to the area of the upper major surface of the integrated circuit package that is directly above the integrated circuit die. By mounting this material only directly above the integrated circuit die, greater thermal balance at the perimeter of the package is maintained thereby preventing warping at the edges of the package. Then the lower major surface of the integrated circuit package is made thinner by lapping or grinding off some of the casing material uniformly and possibly some of the integrated circuit die uniformly. A thin layer of material such as one mil of aluminum or copper with a coefficient of thermal expansion that is approximately that of the casing material used to encapsulate the die which is always significantly greater than the coefficient of thermal expansion of silicon is mounted to the lower major surface of the integrated circuit package to prevent warping. This material is mounted only to the area of the lower major surface of the package that is directly below the integrated circuit die.

Yet another alternative embodiment of the present invention is to confine the lamination of the upper surface after grinding or lapping only that area directly above the integrated circuit die and the extensions that run perpendicular to the leads of the integrated circuit package. Then the lower major surface of the package is lapped or ground off uniformly and a material with a coefficient of thermal expansion approximately equal to the molding material and greater than that of silicon is mounted to the lower major surface of the integrated circuit package. This material mounted to the lower major surface of the package is mounted directly under the area covered by the material mounted to the upper major surface of the package.

In another embodiment, after lapping, warp resistant material is applied to the upper major surface of the package extending only directly above the integrated circuit die. Then polyimide strips are mounted to the upper major surface of the package along the extensions of the package that run perpendicular to the leads. The lower major surface of the package is lapped off uniformly and suitable warp resistant material as in the other embodiments is mounted to the lower major surface of the package to that area directly below the integrated circuit die. Polyimide strips are then mounted to the lower major surface of the package directly under the area where the polyimide strips are mounted to the upper major surface of the package.

Another method of manufacturing a warp-resistant ultra-thin integrated circuit package is by lapping off some of the casing material uniformly across the upper major surface of an integrated circuit package until the casing material across the upper major surface is about 6.0 mils thick. Then about a one mil thick layer of Invar is mounted to the upper major surface of the integrated circuit package with about a 0.4 mil thick layer of high temperature epoxy containing a plasticizer which permits expansion without cracking, such as Able Film TM. The integrated circuit package is further made thinner by lapping off all of the casing material uniformly and some of the integrated circuit die uniformly across the lower major surface of the integrated circuit package until the integrated circuit die is about 5.4 mils thick. Then about a 1.0 mil thick layer of aluminum or copper is mounted to the lower major surface of the integrated circuit package with about a 0.4 mil thick layer of high temperature epoxy containing a plasticizer. Then the integrated circuit package is cured at a temperature of about 175° C. for about two hours at a pressure of about 16 psi.

DETAILED DESCRIPTION OF THE PREFERRED EMBODIMENT

Figure 1:
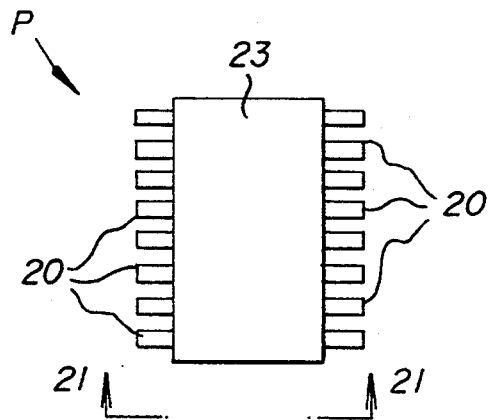
FIG. 1 is a schematic plan view of a standard integrated circuit package.
Figure 2:
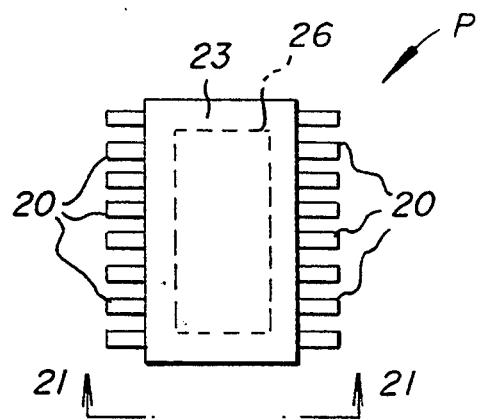
FIG. 2 is a schematic plan view of a standard integrated circuit package illustrating the position of the integrated circuit die.
Figure 3:
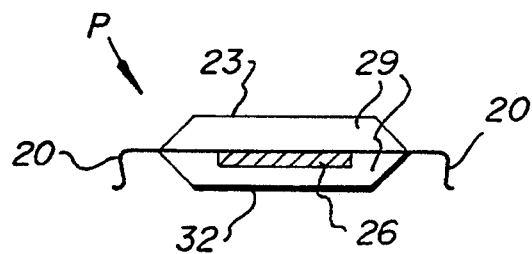
FIG. 3 is a schematic cross-sectional view of FIGS. 1 or 2 taken along section line 21—21.

A better understanding of the present invention can be had when the following detailed description is read with reference to the drawings wherein common elements are designated with like numbers or letters. Referring now to FIGS. 1, 2 and 3, a standard integrated circuit package P is illustrated in schematic plan view and schematic cross-sectional view. The standard integrated circuit package P comprises an integrated circuit die 26 that is surrounded by casing material 29, which is provided with an array of leads 20 for circuit interconnections. A standard integrated circuit package P includes a silicon integrated circuit die 26 having a nominal thickness of from about eight to about sixteen mils. It should be noted that in the drawings, the conductive leads 20 are illustrated as being connected at or near the edge of the integrated circuit die 26 for clarity. It should also be noted that the present invention is not limited to embodiments having leads exiting at two sides and can be readily fabricated to accommodate single or four-sided lead configurations, in either J-lead, gull-wing or other surface mount technology (SMT) lead configurations.

Figure 4:
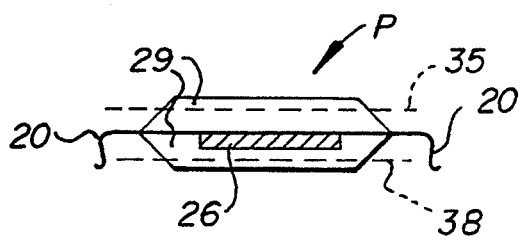
FIG. 4 is a schematic cross-sectional view of FIGS. 1 or 2 taken along section line 21—21 illustrating the removal of some casing material from the upper and lower major surfaces of the integrated circuit package.
Figure 5:
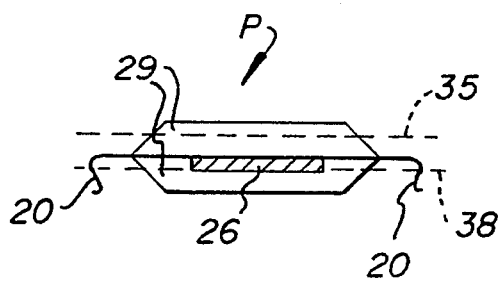
FIG. 5 is a schematic cross-sectional view of FIGS. 1 or 2 taken along section line 21—21 illustrating the removal of some casing material and removal of some of the integrated circuit die.
Figure 5A:
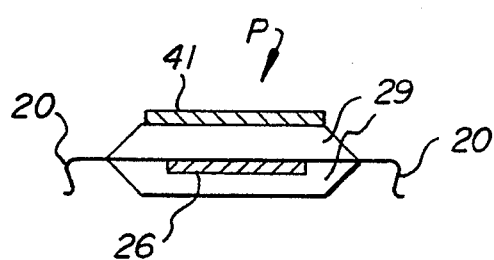
FIG. 5A is a schematic cross-sectional view of an embodiment of the present invention illustrating the mounting of the material to the upper major surface of the integrated circuit package.
Figure 7:
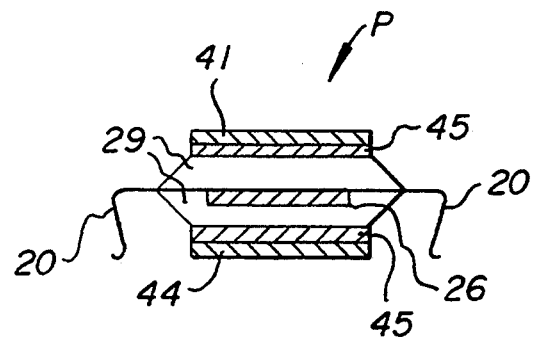
FIG. 7 is a schematic cross-sectional view of an embodiment of the present invention illustrating the mounting of the materials to the upper and lower major surfaces of the integrated circuit package with a thin layer of high temperature epoxy containing a plasticizer which permits expansion without cracking.

Since the principle objective of this invention is to achieve thin, yet durable and reliable circuit packaging, it is important that the molded casing be made as thin as possible without breaking, warping or destroying the integrity of the integrated circuit package P. Referring now to FIGS. 4 and 5, a schematic cross-sectional view of FIGS. 1 or 2 taken along section line 21—21 illustrates the reduction in overall thickness of the integrated circuit package P by removing some casing material 29 uniformly across the upper major surface 23 and the lower major surface 32 of the integrated circuit package P. As shown in FIGS. 4 and 5, the casing material 29 is removed uniformly across the upper major surface 23 of the integrated circuit package P to the point 35 where one has achieved the overall thickness desired. Some of the casing material 29 from surface 23 of the integrated circuit package P is removed by lapping or grinding. However, a thinner integrated circuit package P may warp during fabrication or use due to dissimilar coefficients of thermal expansion in the various layers or component parts which comprise the package P. As illustrated in FIG. 5A, to prevent warping while still maintaining a thin profile, a thin layer of material 41 with a coefficient of thermal expansion less than that of silicon is mounted to surface 23 of the integrated circuit package P after the package P has been thinned somewhat by lapping. Material 41 may be, for example, Invar. As shown in FIG. 7, one possible method of mounting material 41 is by using a high temperature epoxy 45 containing a plasticizer that permits expansion without cracking. An example of a suitable epoxy 45 is Able Film ™. The selected epoxy should also have a good shear characteristic at high temperature, and good resistance to moisture penetration. Alternatively, a high temperature thermoplastic without plasticizer, such as AbleLog ™ T1-5501, may be used in less environmentally demanding applications.

Next, the thickness of the integrated circuit package P is further reduced by removing some of the casing material 29 uniformly across the lower major surface 32 of the integrated circuit package P. As shown in FIGS. 4 and 5, the casing material 29 is removed uniformly across surface 32 of the integrated circuit package P to the point 38 where one has achieved the overall thickness desired.

Figure 6:
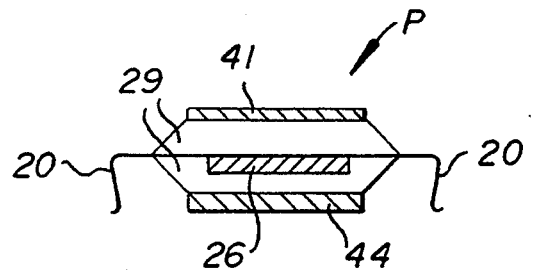
FIG. 6 is a schematic cross-sectional view of an embodiment of the present invention illustrating the mounting of the materials to the upper and lower major surfaces of the integrated circuit package.

In an alternative embodiment, as illustrated in FIG. 6, after some of the casing material 29 is removed from surface 32, a thin layer of material 44 with a coefficient of thermal expansion greater than that of silicon and preferably approximately equal to that of the casing material 29 is mounted to surface 32 of the integrated circuit package P to prevent warping. An example of a suitable material 44 is aluminum or copper. As shown in FIG. 7, one suitable method of mounting material 44 is by using a high temperature epoxy 45 similar to that used on the upper major surface 23. An example of a suitable epoxy 45 is Able Film ™.

Figure 8:
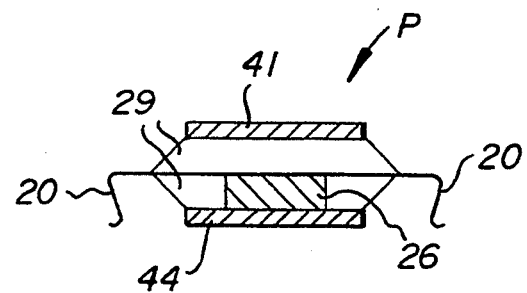
FIG. 8 is a schematic cross-sectional view of an embodiment of the present invention illustrating the removal of the casing material and some of the integrated circuit die from the lower major surface of the package and the mounting of the materials to the upper and lower major surfaces of the integrated circuit package.

FIG. 8 illustrates a preferred embodiment wherein some of the casing material 29 has been removed uniformly from surface 23 of the integrated circuit package P and a thin layer of material 41 with a coefficient of thermal expansion less than that of silicon is mounted to surface 23 of the package P. The casing material 29 on surface 32 of the package P is removed uniformly and some of the lower surface of the integrated circuit die 26 is removed uniformly from surface 32 of the package P. Then a thin layer of material 44 with a coefficient of thermal expansion greater than that of silicon and preferably approximately equal to that of the casing material 29 is mounted to surface 32 of the integrated circuit package P to prevent warping.

Figure 9:
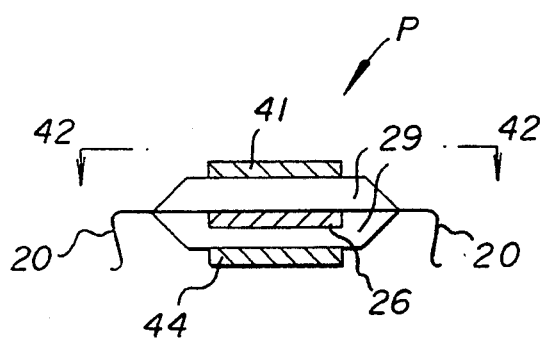
FIG. 9 is a schematic cross-sectional view of an embodiment of the present invention illustrating the mounting of the materials to the upper and lower major surfaces of the integrated circuit package only directly above and below the integrated circuit die.
Figure 10:
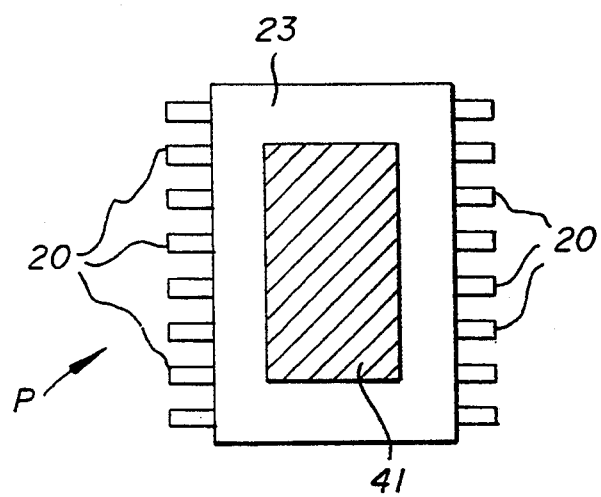
FIG. 10 is a schematic plan view of FIG. 9 taken along section line 42—42.

FIGS. 9 and 10 illustrate another preferred embodiment wherein some of the casing material 29 has been removed uniformly from surface 23 of the integrated circuit package P and a thin layer of material 41 with a coefficient of thermal expansion less than that of silicon is mounted only to the area of surface 23 that is directly above the integrated circuit die 26. By mounting this material 41 only directly above the integrated circuit die 26, greater thermal balance at the perimeter of the package P is maintained thereby preventing warping at the edges of the package. Next, some of the casing material 29 on surface 32 is removed uniformly across surface 32 of the integrated circuit package P. A thin layer of material 44, such as one mil of aluminum or copper, with a coefficient of thermal expansion greater than that of silicon is mounted only to the area of surface 32 that is directly below the integrated circuit die 26 to prevent warping.

Figure 11:
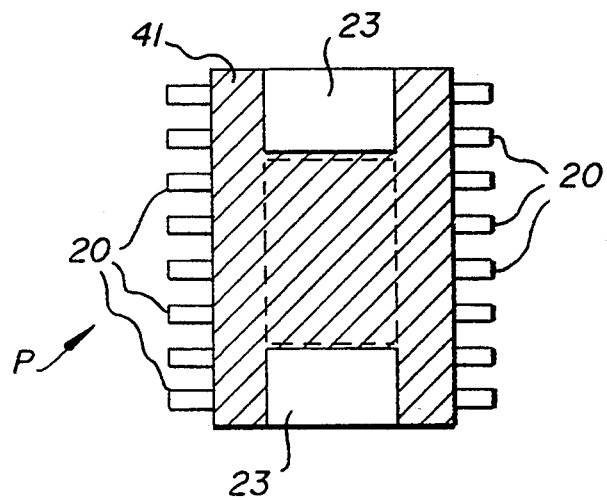
FIG. 11 is a schematic plan view of an embodiment of the present invention illustrating the mounting of materials to certain areas of the upper and lower major surfaces of the integrated circuit package.

FIG. 11 illustrates another preferred embodiment wherein some of the casing material 29 has been removed uniformly across surface 23 of the integrated circuit package P. Then a suitable warp-resistant material 41 as in the other embodiments is mounted only to the area of surface 23 that is directly above the integrated circuit die 26 and over the extensions that run perpendicular to the leads 20 of the package P. By mounting this material 41 only directly above the integrated circuit die 26 and over the extensions that run perpendicular to the leads 20 of the integrated circuit package P, solder balls are prevented from forming along the edge of the mounted material 41 while still maintaining thermal balance at the perimeter of the package P. Solder balls can result in electrical shorts between the leads 20 or between stacked integrated circuit packages P. Solder balls also make the surface 23 rough thus making the package P less aesthetically pleasing as well as making it more difficult to stack integrated circuit packages P.

Thereafter, the package P is further thinned by removing some of the casing material 29 uniformly across surface 32 of the package P. A suitable warp-resistant material 44 as in the other embodiments is mounted only to the area of surface 32 that is directly below the integrated circuit die 26 and directly below the material 41 mounted to surface 23 of the package P. This prevents the formation of solder balls along the edges of the material 44 mounted to surface 32 and prevents warping by retaining a thermal balance throughout the integrated circuit package P.

Figure 12:
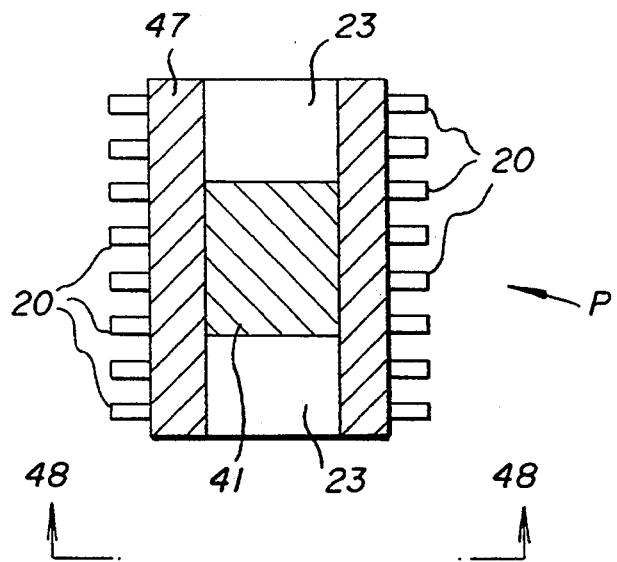
FIG. 12 is a schematic plan view of an embodiment of the present invention illustrating the mounting of material to the upper and lower major surfaces of the integrated circuit package directly above and below the integrated circuit die and the mounting of polyimide strips to the upper and lower major surfaces of the integrated circuit package.
Figure 13:
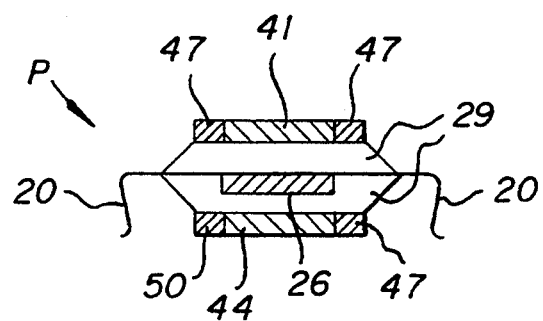
FIG. 13 is a schematic cross-sectional view of FIG. 12 taken along section line 48—48.

FIGS. 12 and 13 illustrate another preferred embodiment wherein some of the casing material 29 has been removed uniformly across surface 23 of the integrated circuit package P. Then a thin layer of material 41 with a coefficient of thermal expansion less than that of silicon is mounted only to the area of surface 23 that is directly above the integrated circuit die 26. Then strips of material 47 such as polyimide are mounted to surface 23 of the package P along the extensions of the package P that run perpendicular to the leads 20 of the package P. Mounting the material 41 only directly above the integrated circuit die 26 and the strips of material 47 prevents the formation of solder balls along the edge of the mounted material 41, while still maintaining thermal balance at the perimeter of the package P. Solder balls can result in electrical shorts between the leads 20 or between stacked integrated circuit packages P. Solder balls also make the surface 23 rough thus making the package P less aesthetically pleasing as well as making it more difficult to stack integrated circuit packages P.

Next, the package P is further thinned by removing some of the casing material 29 uniformly across surface 32 of the integrated circuit package P. A thin layer of material 44 with a coefficient of thermal expansion greater than that of silicon is mounted only to the area of surface 23 that is directly below the integrated circuit die 26. Strips of material 50 such as polyimide are then mounted to surface 32 along the extensions of the package P that an perpendicular to the leads 20 and directly below the material 47 mounted to surface 23 of the package P. This prevents the formation of solder balls along the edges of the material 44 mounted to surface 32 and prevents warping by retaining a thermal balance throughout the integrated circuit package P.

The present invention provides a method of warpage control that minimizes the differential thermal expansion forces and moments between the material layers on either side of a neutral thermodynamic axis in the assembly. The neutral thermodynamic axis is chosen for convenience to be the plane through the center of the copper lead frame. The total warpage-causing moments on either side of the neutral thermodynamic axis are the sum of the moments associated with each layer, relative to the neutral thermodynamic axis. For a particular layer, the moment, m, is proportional to the following product:

$$m = (E)(h)(t)\Delta(a)\Delta(T)$$

where m is the moment of the layer; E is the Young's modulus of elasticity of the layer material; h is the moment-arm distance of the center of the layer from the neutral thermodynamic axis; t is the layer thickness; $\Delta(a)$ is the difference in CTE of the layer and that of the material containing the neutral thermodynamic axis; and $\Delta(T)$ is the temperature difference between assembly bonding temperature and operation, storage, or other temperatures of interest.

The product $\Delta(a)\Delta(T)$ is the source of forces and moments, the product $(E)(t)$ is the deflection compliance of the layer with the differential force, and h is the lever arm allowing the force to produce a moment with its resulting warpage.

The product in the above equation, for moment, m, is evaluated for each layer on one side of the neutral thermodynamic axis and these values summed. The process is repeated for the layers on the opposite side of the neutral thermodynamic axis and the two sums compared. The package materials and dimensions are then adjusted until the sums are either equal or acceptably close enough in value to assure acceptably low values of warpage. In other words, the vectorial summation of all of the moments of each layer is as close to zero as possible.

A key advantage of the present invention is that one can asymmetrically locate elements formed of different materials in the package P and thermally balance them. Thus the integrated circuit die 14 does not have to be symmetrically centered in the package P in order to obtain thermal balance throughout the integrated circuit package P. Application of the method of the present invention allows one to compensate for material and orientation asymmetries in the integrated circuit package P to prevent warping.

The foregoing disclosure and description of the invention are illustrative and explanatory of the preferred embodiments, and changes in the size, shape, materials and individual components, circuit elements, connections and construction may be made without departing from the spirit of the invention.

What is claimed is:

1. A method of manufacturing a warp-resistant integrated circuit package of the type that includes a molded casing containing an integrated circuit die formed on a silicon substrate comprising the steps of:
   providing an integrated circuit package having upper and lower major surfaces;
   reducing the overall thickness of said integrated circuit package by removing some casing material uniformly across said upper major surface;
   mounting a thin layer of material with a coefficient of thermal expansion less than or equal to the coefficient of thermal expansion of silicon to said upper major surface of said integrated circuit package; and
   reducing the overall thickness of said integrated circuit package by removing some casing material uniformly across said lower major surface.

2. The method of claim 1, further comprising the step of removing all of the casing and some of the integrated circuit die uniformly from the lower major surface.

3. The method of claim 1 or 2, further comprising the step of:
   mounting a thin layer of material with a coefficient of thermal expansion greater than the coefficient of thermal expansion of silicon to said lower major surface of said integrated circuit package.

4. The method of claim 3, wherein said material mounted to said lower major surface has a coefficient of thermal expansion approximately equal to that of said casing material.

5. The method of claim 1, wherein removing casing material is done by lapping.

6. The method of claim 1, wherein removing casing material is done by grinding.

7. The method of claim 1, wherein mounting the materials is by adhering with high temperature epoxy containing a plasticizer that permits expansion without cracking.

8. The method of claim 3, wherein mounting the materials is by adhering with high temperature epoxy containing a plasticizer that permits expansion without cracking.

9. The method of claim 1, wherein said material with a coefficient of thermal expansion less than the coefficient of thermal expansion of silicon is Invar.

10. The method of claim 3, wherein said material with a coefficient of thermal expansion greater than the coefficient of thermal expansion of silicon is aluminum.

11. The method of claim 3, wherein said material with a coefficient of thermal expansion greater than the coefficient of thermal expansion of silicon is copper.

12. The method of claim 3, wherein the thickness of the casing material of the upper major surface is reduced to 6.0 mil and the thickness of the die is reduced to 5.4 mil.

13. The method of claim 3, wherein said thin layers of material mounted to said upper and lower major surfaces are mounted only directly above and below the silicon die of the integrated circuit package, respectively.

14. The method of claim 13, further comprising the step of mounting polyimide strips to said upper and lower major surfaces only covering the areas along the extensions that run perpendicular to the leads of the integrated circuit package that are not directly above or below said integrated circuit die.

15. The method of claim 3, wherein said thin layers of material mounted to said upper and lower major surfaces are mounted directly above and below the integrated circuit die, respectively, and over and below the extensions of the surfaces that run perpendicular to the leads of said integrated circuit package, respectively.

16. A method of manufacturing a warp-resistant integrated circuit package of the type that includes plastic casing material comprising the steps of:
providing an integrated circuit package having upper and lower major surfaces;
reducing the overall thickness of said integrated circuit package by removing some casing material uniformly across said upper major surface until said casing material across said upper major surface is about 6.0 mils thick;
mounting a thin layer of Invar that is about 1.2 mils thick to said upper major surface of said integrated circuit package with high temperature epoxy containing a plasticizer which permits expansion without cracking that is 0.4 mils thick;
reducing the overall thickness of said integrated circuit package by removing all of the casing material uniformly from the lower major surface of said integrated circuit package and removing some of the integrated circuit die uniformly from the lower major surface until said die is about 5.4 mils thick;
mounting a thin layer of aluminum that is about 1.0 mils thick to said lower major surface of said integrated circuit package with high temperature epoxy containing a plasticizer which permits expansion without cracking that is 0.4 mils thick; and
curing the integrated circuit package at a temperature of about 175° C. for about two hours at a pressure of about 16 psi.

17. A method of manufacturing a warp-resistant integrated circuit package of the type that includes a molded casing containing an integrated circuit die formed on a silicon substrate and having a neutral thermodynamic axis coinciding with the plane through the center of the copper lead frame, comprising the steps of:
providing an integrated circuit package having upper and lower major surfaces;
reducing the overall thickness of said integrated circuit package by removing some casing material uniformly across said upper major surface;
mounting a thin layer of material with a coefficient of thermal expansion less than or equal to the coefficient of thermal expansion of silicon to said upper major surface of said integrated circuit package;
reducing the overall thickness of said integrated circuit package by removing some casing material uniformly across said lower major surface; and
selecting the thickness and orientation of the layers comprising, and mounted to, said integrated circuit package in relation to the other layers and to the neutral thermodynamic axis such that the vectorial summation of all the moments of each layer is as close to zero as possible, wherein the dimensions of said layers of material are calculated using the equation:

$$m \approx (E)(h)(t)\Delta(a)\Delta(T)$$

where m is the moment of the layer; E is the Young's modulus of elasticity of the layer material; h is the moment-arm distance of the center of the layer from the neutral thermodynamic axis; t is the layer thickness; $\Delta(a)$ is the difference in CTE of the layer and that of the material containing the neutral thermodynamic axis; and $\Delta(T)$ is the temperature difference between assembly bonding temperature and operation, storage, or other temperatures of interest.

18. The method of claim 17, further comprising the step of:
mounting a thin layer of material with a coefficient of thermal expansion greater than the coefficient of thermal expansion of silicon to said lower major surface of said integrated circuit package.

* * * * *